United States Patent
Chang et al.

(10) Patent No.: US 7,732,928 B2
(45) Date of Patent: Jun. 8, 2010

(54) STRUCTURE FOR PROTECTING ELECTRONIC PACKAGING CONTACTS FROM STRESS

(75) Inventors: Shyh-Ming Chang, Hsinchu (TW); Ji-Cheng Lin, Sinjhuang (TW); Shou-Lung Chen, Yangmei Township, Taoyuan County (TW)

(73) Assignee: Instrument Technology Research Center, Hsinchu (TW)

( * ) Notice: Subject to any disclaimer, the term of this patent is extended or adjusted under 35 U.S.C. 154(b) by 0 days.

(21) Appl. No.: 11/516,944

(22) Filed: Sep. 6, 2006

(65) Prior Publication Data
US 2007/0096279 A1 May 3, 2007

(30) Foreign Application Priority Data
Oct. 31, 2005 (TW) .............................. 94138174 A

(51) Int. Cl.
*H01L 23/02* (2006.01)
*H01L 27/115* (2006.01)

(52) U.S. Cl. .................... 257/776; 257/679; 257/737; 257/E23.116; 257/E23.178

(58) Field of Classification Search ................. 257/679, 257/737, E23.116, E23.178; 438/613
See application file for complete search history.

(56) References Cited

U.S. PATENT DOCUMENTS

| | | | |
|---|---|---|---|
| 5,757,072 A | 5/1998 | Gorowitz et al. | ............. 257/700 |
| 5,866,952 A | 2/1999 | Wojnarowski et al. | ...... 257/788 |
| 6,255,686 B1 * | 7/2001 | Takeuchi et al. | ............. 257/306 |
| 6,284,596 B1 * | 9/2001 | Sung et al. | .................... 438/257 |
| 6,406,004 B1 * | 6/2002 | Ude | ............................. 261/26 |
| 6,586,836 B1 | 7/2003 | Ma et al. | ..................... 257/723 |
| 6,642,099 B2 * | 11/2003 | Arimochi et al. | ............. 438/244 |
| 6,888,230 B1 * | 5/2005 | Ogino et al. | ................. 257/669 |
| 2002/0145143 A1 * | 10/2002 | Kawasaki et al. | ............. 257/72 |
| 2002/0191238 A1 * | 12/2002 | Towery | ........................ 359/18 |
| 2003/0155145 A1 * | 8/2003 | Ou et al. | ..................... 174/52.1 |
| 2005/0087859 A1 * | 4/2005 | Chao et al. | ................... 257/700 |
| 2005/0205978 A1 * | 9/2005 | Pu et al. | ..................... 257/678 |
| 2006/0103020 A1 * | 5/2006 | Tong et al. | ................... 257/738 |
| 2008/0054460 A1 * | 3/2008 | Hung | ......................... 257/737 |

OTHER PUBLICATIONS

Office Action dated Nov. 23, 2007, in a People's Republic of China (PRC) patent application CN 2005101287175 which also claims priority to the same Taiwanese application (094138174) as the current application (U.S. Appl. No. 11/516,944).
Chinese Patent No. CN 1260590A dated Jul. 19, 2000.
English Translation of Notification of First Office Action dated Nov. 23, 2007, in a People's Republic of China (PRC) patent application CN 2005101287175 which also claims priority to the same Taiwanese application (094138174) as the current application (U.S. Appl. No. 11/516,944).
Amendment of Claims as filed on Apr. 7, 2008 in Chinese Patent Application No. CN 2005101287175, including an English Translation thereof.

* cited by examiner

*Primary Examiner*—Alexander O Williams

(57) ABSTRACT

A structure for protecting electronic package contacts is provided. The structure includes at least an electronic contact mounted on a chip, a dielectric layer, a conductor trace line and a protective layer. The protective layer is used to prevent stresses from being gathered within electronic contacts on the chip through surroundingly covering the conductor trace line.

17 Claims, 12 Drawing Sheets

STRUCTURE FOR PROTECTING ELECTRONIC PACKAGING CONTACTS FROM STRESS

FIELD OF THE INVENTION

The present invention relates to an electronic package structure and the manufacturing method thereof, and more particularly to a structure for protecting electronic package contacts and the manufacturing method thereof.

BACKGROUND OF THE INVENTION

While more convenient life for human being is ongoing and driven by rapid changing technology, demands for electronic products tend to deliver multiple functionality, high-speed transmission of electronic signals, and high density of circuit components. Particularly for consuming electronic products, the larger number of passive components embedded in the IC is, the more functions performed thereby will be. Therefore, how to accommodate the large number of electronic components in the limited packaging space has become a technical bottleneck to be overcome. To solve the above-mentioned problem, package technique is guided by market segments to progressively develop towards the level of Sip (system in package), and the embedded technology and the build-up technology become crucial. Components buried interiorly shorten the packaging space extensively, where more components with high performance can be integrated into the saving space within the package. Furthermore, the build-up technology increases high density of the circuit and reduces the thickness of components, thereby raising the overall packaging density of the product.

However, the size of layout and the space between electronic components on the chip become much tinier due to the extensively space-limited packaging and higher contact density. Therefore, stresses are easily provoked to gather in terminal contacts of the chip or via holes for rerouting when the environment is changed by different factors and exterior forces. Those areas on the chip with higher stress usually cause the terminal contacts to be damaged or cause the conducting wires to be broken, thereby disabling the chip.

Please referring to FIG. 1, the U.S. Pat. No. 5,757,072 disclosed that the protective cap 16 is used to cover the chip 12a and the positive and passive components 12 which are sensible and easily interfered by exterior forces, in order to protect the overall manufacturing process from contamination within the high-density interconnecting structure 10. However, in this patent, the protective cap 16 needs to be additionally manufactured and the structure thereof is quite complicated, and thus the cost therefor is high.

Please referring to FIG. 2, the U.S. Pat. No. 6,586,836 disclosed that the second die assembly 162 is used to reduce warpage of the microelectronic die, which prevents the microelectronic die from being disabled due to the gathering stress resulting from warpage. However, this is only applied in the microelectronic dice with multiple chips. As described above, the technique is applied in limited fields and its procedures are more complicated.

Please referring to FIG. 3, the U.S. Pat. No. 5,866,952 disclosed that the compliant material 17 is deposited around the chips 14 and 20, and then a mold form is positioned around the chips prior to molding a polymeric substrate therearound within the high-density interconnecting structure 26. Hence, the chip is normally operated by preventing from the gathering stress thereon.

In order to overcome the drawbacks in the prior art, a structure for protecting an electronic package contact and the method thereof are provided. The particular designs in the present invention not only solve the problems described above, but also are easy to be implemented. Thus, the invention has the utility for the industry.

SUMMARY OF THE INVENTION

The present invention provides a protecting structure. The protecting structure protects conductor trace lines and via holes on the chip effectively to avoid the damage of the electronic terminal contacts or the broken conducting wires for rerouting, thereby enhancing the reliability of the conductor trace lines.

In accordance with one aspect of the present invention, a structure for protecting electronic package contacts is provided. The structure comprises a chip, at least a dielectric layer, a conductor trace line and a protecting layer. The chip has a plurality of electrodes and at least one dielectric layer covering the chip and the electrode. The conductor trace line is mounted within the at least one dielectric layer and is in a lengthwise direction to connect electronic signals within the dielectric layer. The protecting layer at least covers a surrounding of the conductor trace line.

Preferably, the protecting layer has a material of compressible macromolecules and the protecting layer covers the chip incompletely. The protecting layer covers the surrounding of the conductor trace line without contacting therewith.

In accordance with another aspect of the present invention, a protecting structure for electronic package contacts is provided. The structure comprises a chip, a substrate, at least a dielectric layer, a conductor trace line and a protecting layer. The chip has the plurality of electrodes. The substrate is mounted on one side of the chip and is used to support and distract heat form the chip. At least one dielectric layer covers the chips and the plurality of electrodes. The conductor trace line is mounted within the dielectric layer and is in a lengthwise direction to connect electronic signals within the dielectric layer. The protecting layer at least covers the surrounding of the conductor trace line.

Preferably, the protecting layer covers the chips incompletely and the protecting layer covers the surrounding of the conductor trace line without contacting therewith.

In accordance with another aspect of the present invention, a manufacturing method for protecting electronic package contacts is provided. The method comprises the following steps of providing a chip having a plurality of electrodes; forming a protecting layer covering the chip and the plurality of electrodes; forming a dielectric layers covering the protecting layer and the chip; forming a via within the protecting and dielectric layers and forming a conductor trace line within the via.

The above aspects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
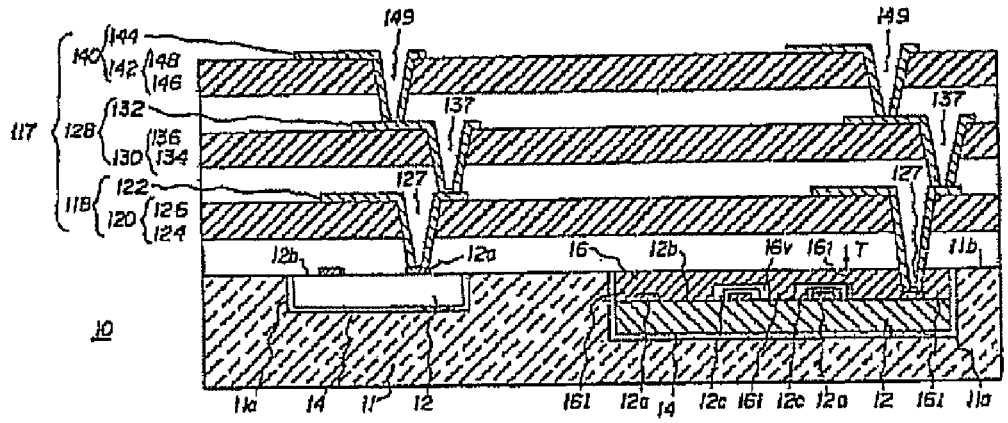
FIG. 1 is a cross-section view of the chip covered with the protecting layer according to U.S. Pat. No. 5,757,072.
Figure 2:
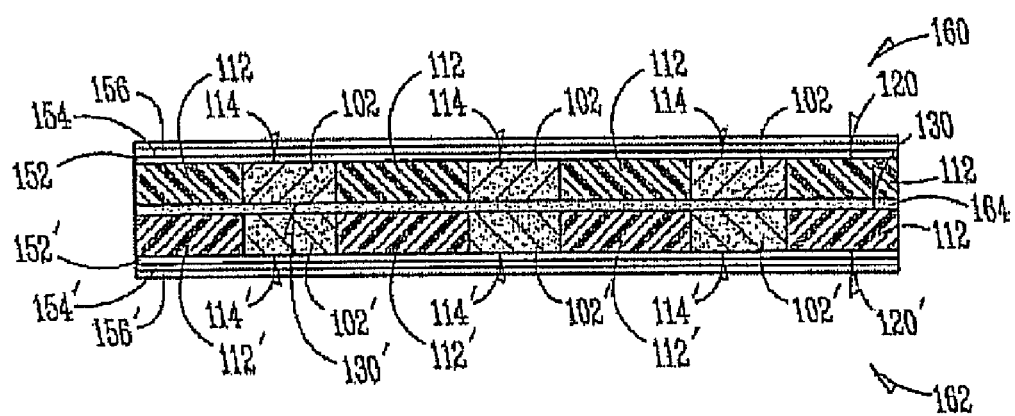
FIG. 2 is a cross-section view of the chip with the microelectronic die to reduce wargage of the embedded chip according to U.S. Pat. No. 6,866,952.
Figure 3:
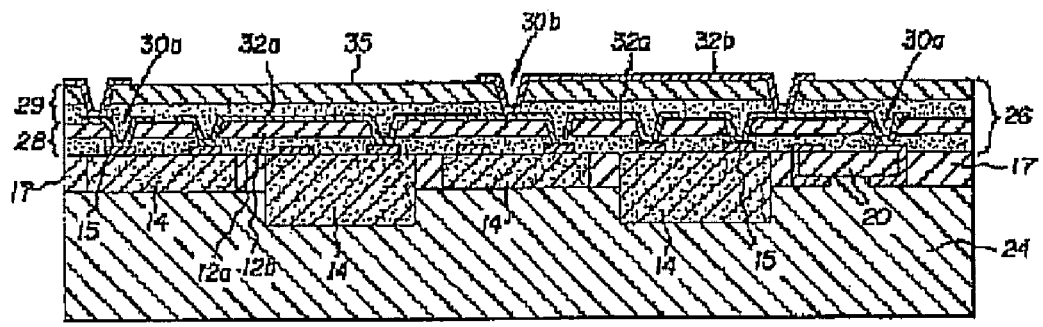
FIG. 3 is a cross-section view of the chip with the compliant material to reduce stresses according to U.S. Pat. No. 5,866,952.
Figure 4:
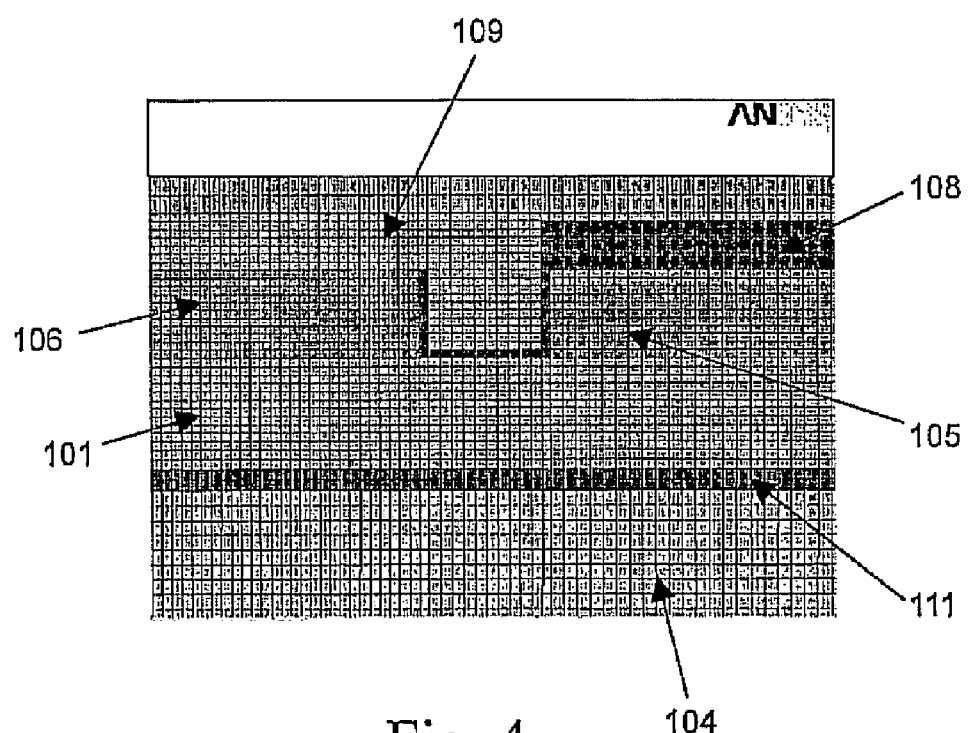
FIG. 4 is a cross-section view of the stress simulation analysis model of the semiconductor component according to the present invention.

Please refer to FIG. 4, which is a cross-section view of the stress simulation analysis model of the semiconductor component according to the present invention. The model comprises a semiconductor chip 101, a substrate 104, a conductor trace line 108, a protecting layer 105 and dielectric layers 106 and 109. The semiconductor chip 101 is coated on the substrate 104 through a gel 111, and the substrate 104 is selected form one consisting of an organic circuit substrate and a metal substrate. The protecting layer 105 covers a surrounding of the conductor trace line 108, and the dielectric layers 106 and 109 are formed on the protecting layer 105.

Figure 5:
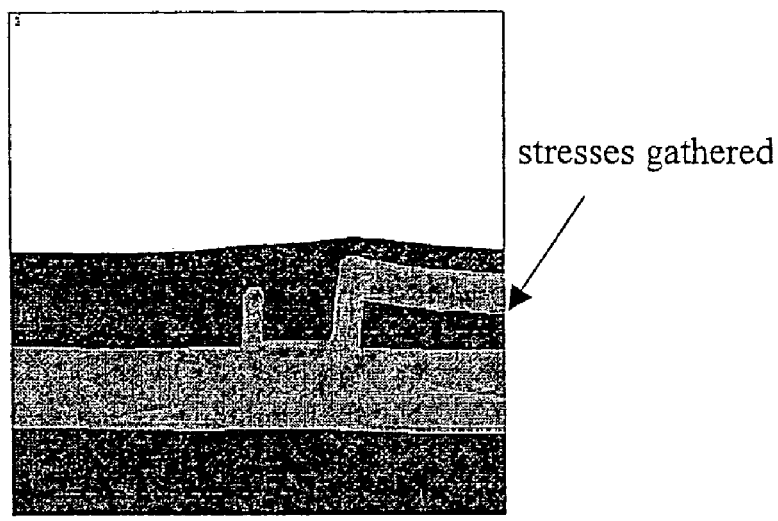
FIG. 5 is a cross-section view of the simulation result of the simulation structure without the protecting layer according to the present invention.

Please refer to FIG. 5, which is a cross-section view of the simulation result of the simulation structure without the protecting layer according to the present invention. As pointed by the arrow in FIG. 5, the stress gathering area will be formed when the surrounding of the conductor trace line is not covered with the protecting layer.

Figure 6:
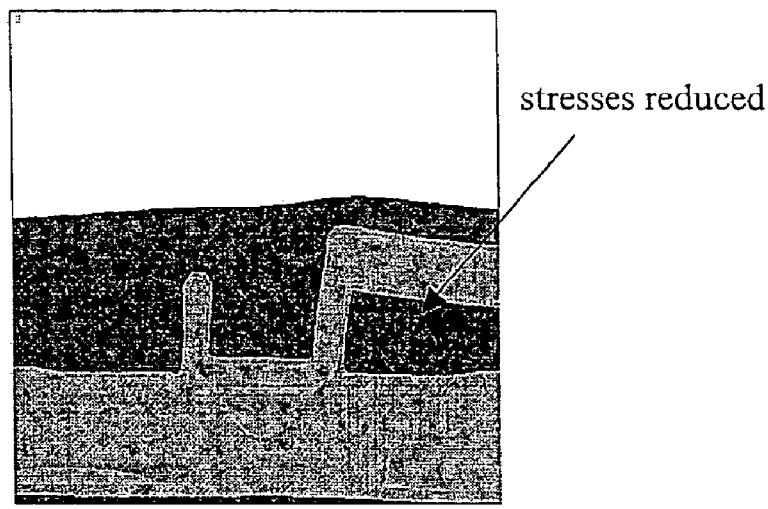
FIG. 6 is a cross-section view of the simulation result of the simulation structure with the protecting layer according to the present invention.

Please refer to FIG. 6, which is a cross-section view of the simulation result of the simulation structure with the protecting layer according to the present invention. As pointed by the arrow in FIG. 6, the stress will be reduced when the surrounding of the conductor trace line is covered with the protecting layer.

Figure 7:
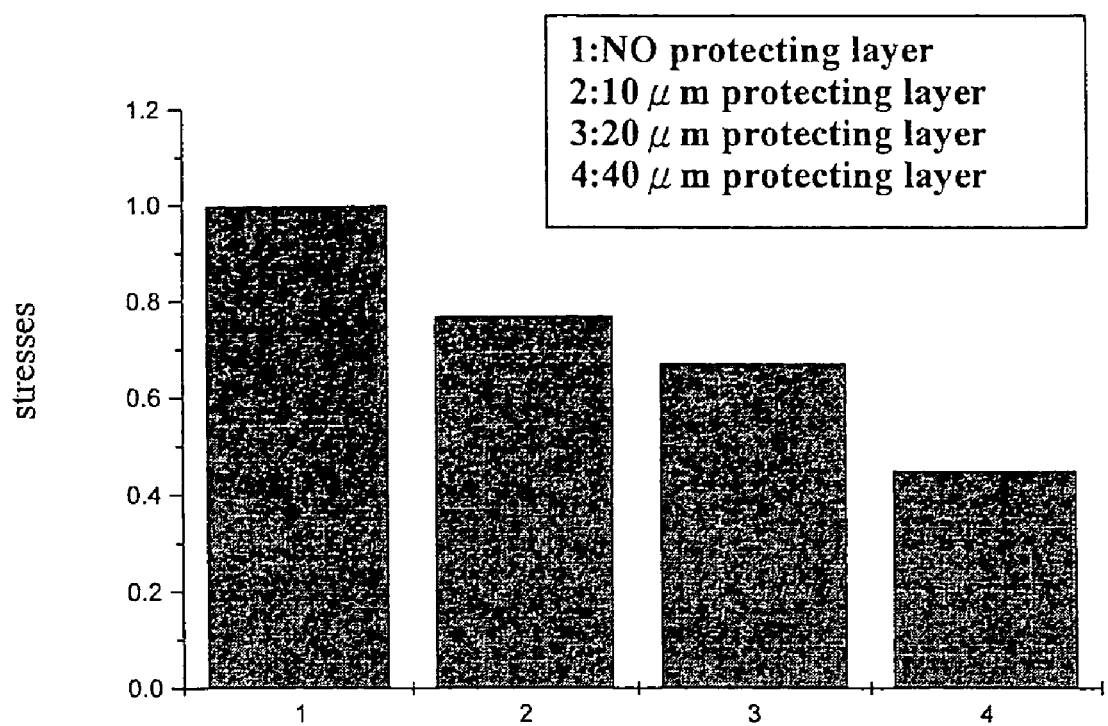
FIG. 7 shows the relationship between the thickness of the protecting layer and the quantity of stresses.

Please refer to FIG. 7, which shows the relationship between the thickness of the protecting layer and the quantity of stresses. As illustrated in FIG. 7, the thicker the protecting layer is, the better capability for distracting stresses will be.

Figure 8A:
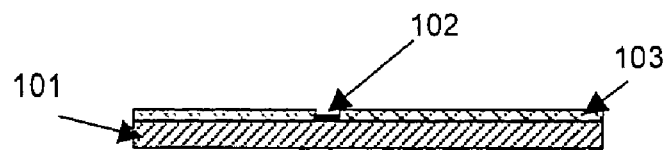
FIGS. 8(a)-8(g) are cross-section views of the manufacturing process for the packaging structure according to a first preferred embodiment of the present invention.
Figure 8B:
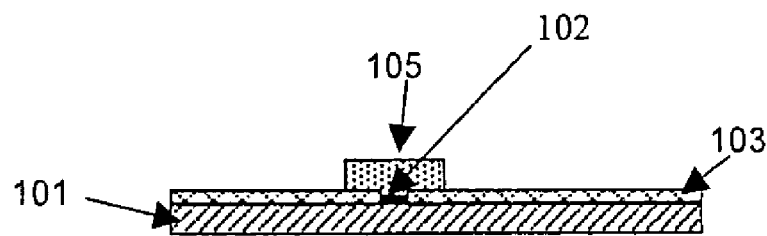
Figure 8C:
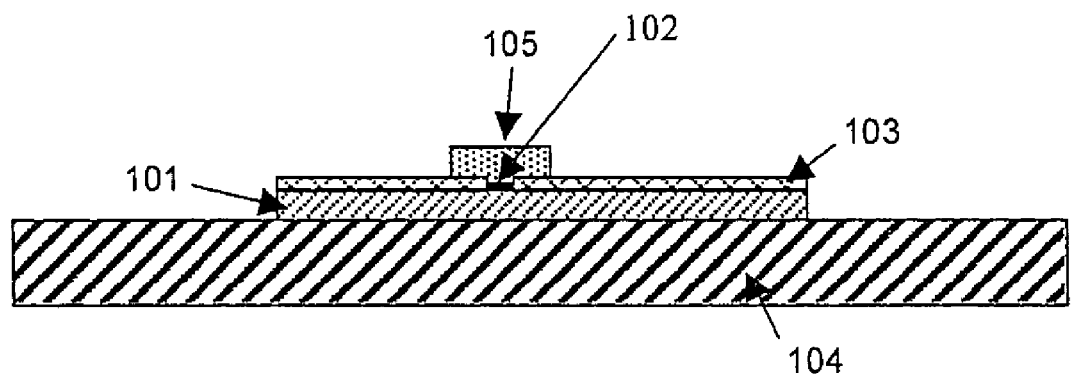
Figure 8D:
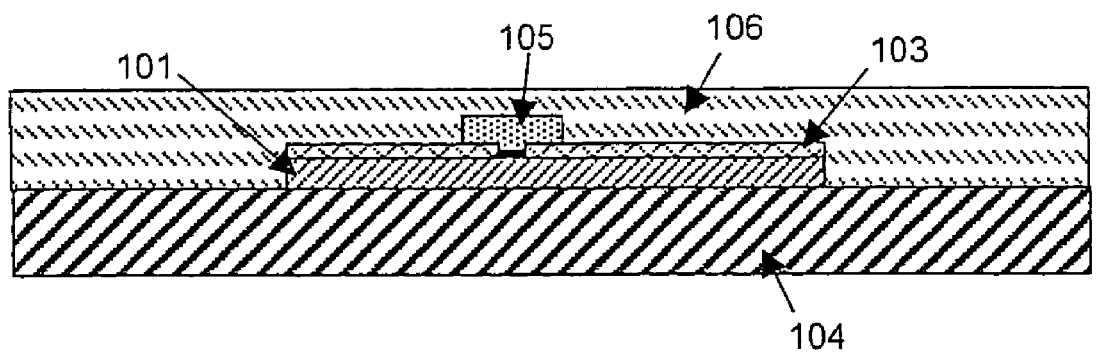
Figure 8E:
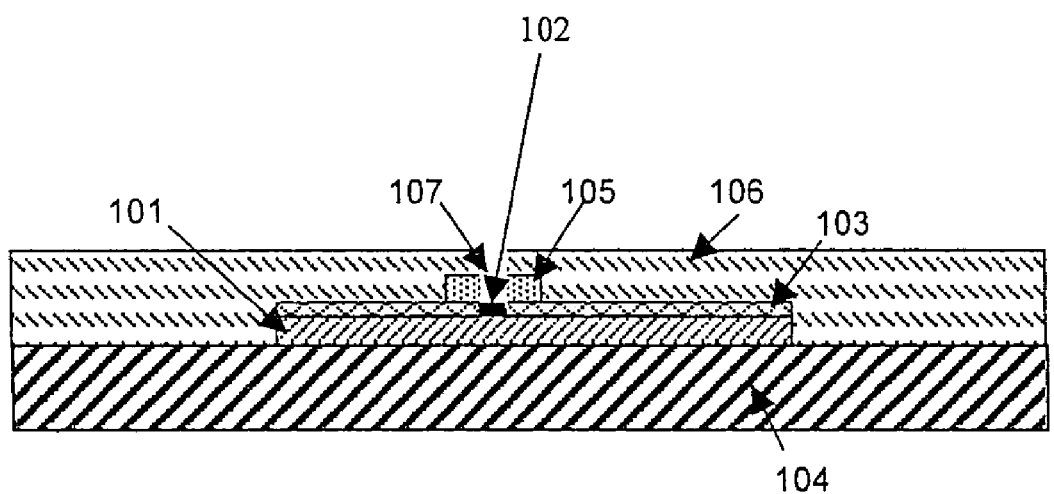
Figure 8F:
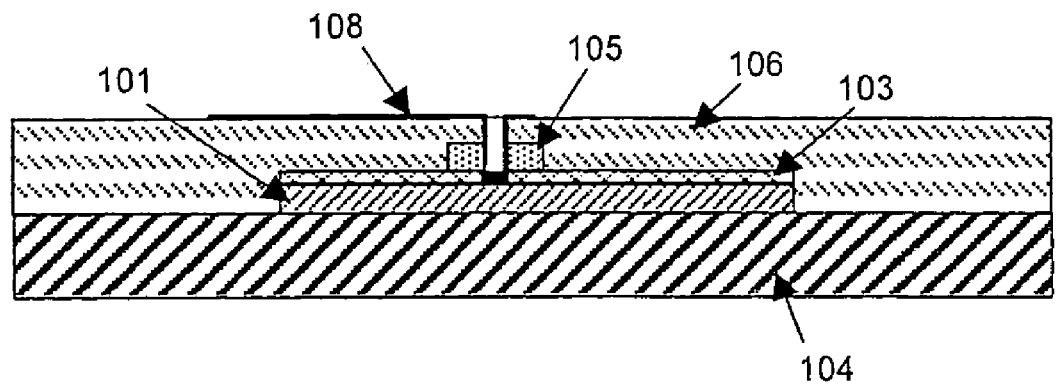
Figure 8G:
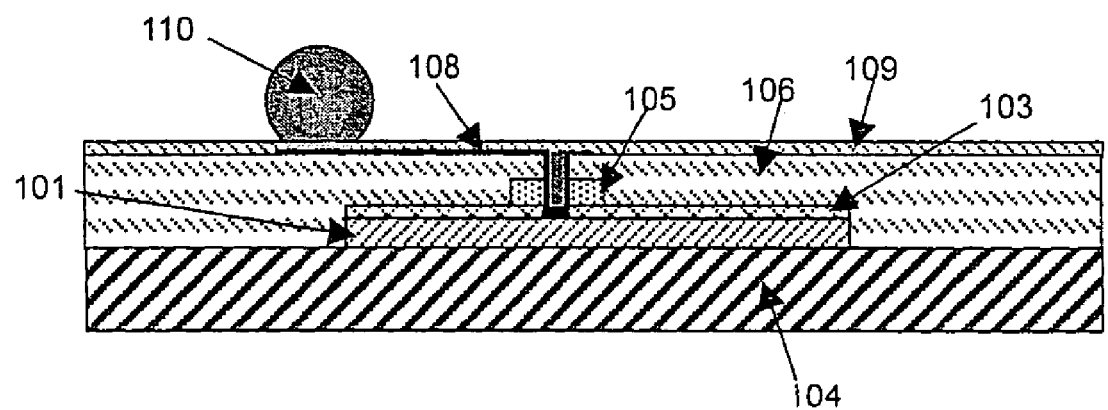

Please refer to FIGS. 8(a)-8(g), which are cross-section views of the manufacturing process for the packaging structure according to a first preferred embodiment of the present invention. As illustrated in FIG. 8(a), a semiconductor chip 101 with the integrated circuit comprises input/output electrodes 102 and a first dielectric layer 103 formed on the semiconductor chip 101. As illustrated in FIG. 8(b), the protecting layer 105 is formed on the electrodes 102 and the first dielectric layer 103 by printing, depositing or photolithographing after spinning coating. In FIG. 8(b), the protecting layer 105 is only formed on top of the electrode 102 instead of being coated on the overall packaging surface area. Therefore, not only the wargage of the semiconductor chip 101 due to the coating of the protecting layer 105 can be avoided, but the cost of material can be reduced. The materials of the protecting layer 105 can be composed of polyimide and BCB macromolecules, and the shape of the protecting layer 105 may be circular, square, irregular, or any other shape. As illustrated in FIG. 8(c), the semiconductor chip 101 is disposed on the organic substrate 104. As illustrated in FIG. 8(d), a second dielectric layer 106 is formed on the first dielectric layer 103 and the protecting layer 105 by coating, depositing, or printing. As illustrated in FIG. 8(e), the via 107 within the protecting layer 105 and the second dielectric layer 106 and above the electrodes 102 is formed by laser drilling, dry etching, or wet etching. As illustrated in FIG. 8(f), the conductor trace line 108 is formed on the second dielectric layer 106 and within the via 107 by electroplating, depositing or printing. Since partially surrounded by the protecting layer 105, the conductor trace line 108 can be protected thereby. As illustrated in FIG. 8(g), the dielectric layer 109 ends conductive protruding block 110 are finally formed.

Figure 9:
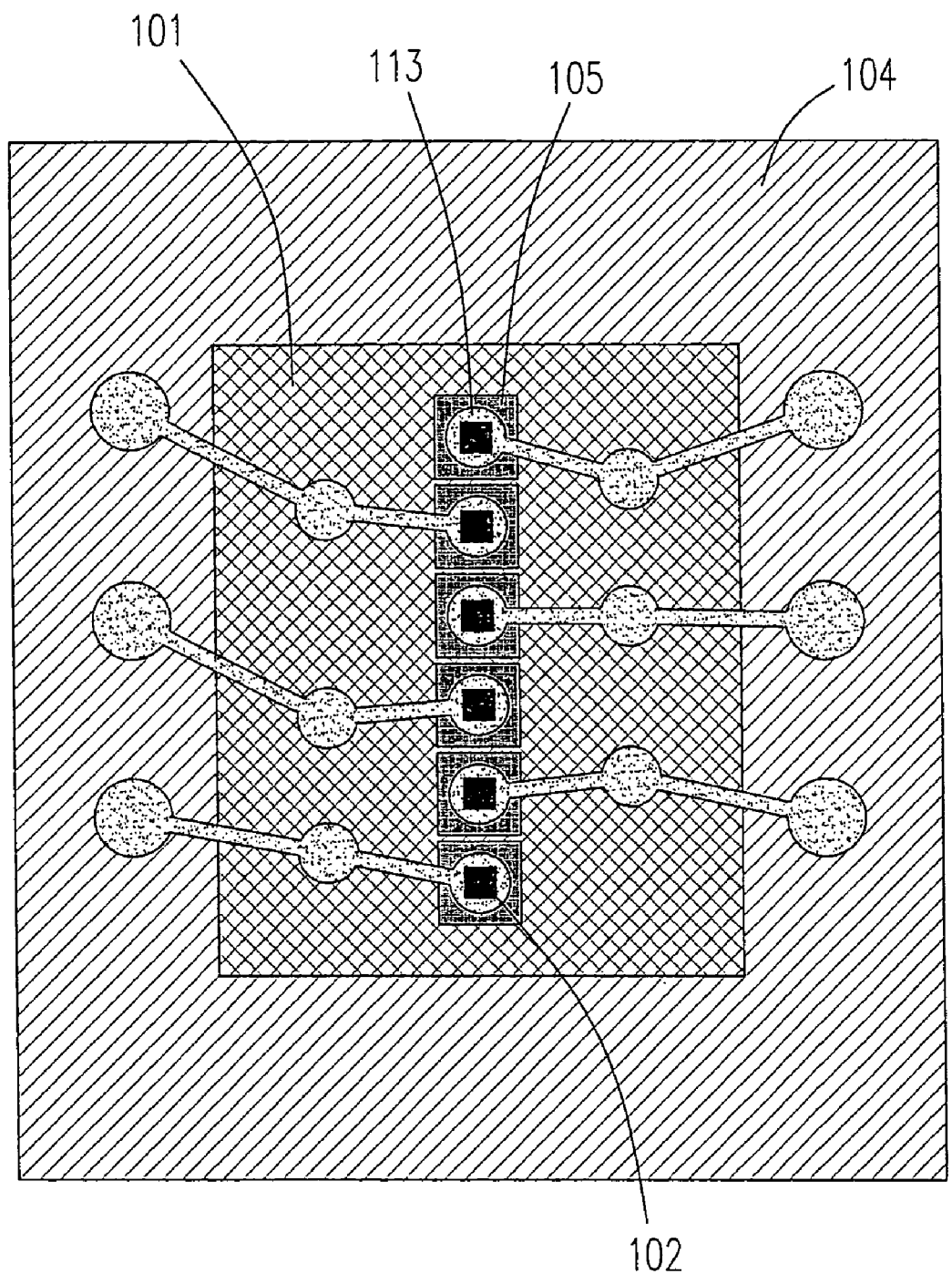
FIG. 9 is a vertical view of the packaging structure according to the first preferred embodiment of the present invention.

Please refer to FIG. 9, which is a vertical view of the packaging structure according to the first preferred embodiment of the present invention. As illustrated in FIG. 9, the semiconductor chip 101 having input/output electrodes 102 is disposed on the organic substrate 104, and the protecting layer 105 is formed in the surrounding of a conductor trace line 113.

Figure 10:
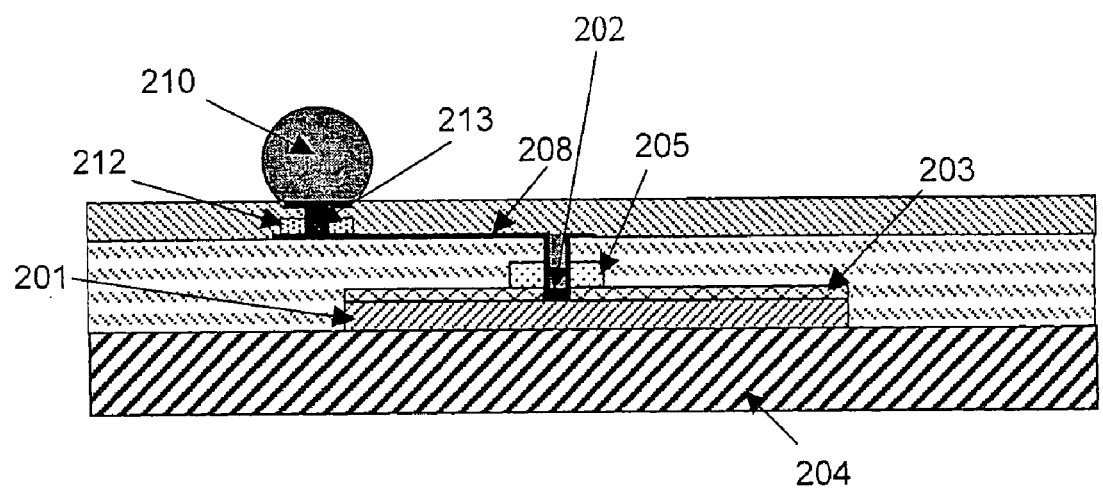
FIG. 10 is a cross-section view of the packaging structure according to a second preferred embodiment of the present invention.

Please refer to FIG. 10, which is a cross-section view of the packaging structure according to a second preferred embodiment of the present invention. A semiconductor chip 201 with the integrated circuit is disposed on the substrate 204 and has input/output electrodes 202 and a dielectric layer 203 formed on the electrodes 202. Besides a first protecting layer 205 of the first preferred embodiment, a second protecting layer 212 is made to cover the surrounding of a conductor trace line 213 and is positioned between a conductor trace line 208 and a conductive protruding block 210.

Figure 11:
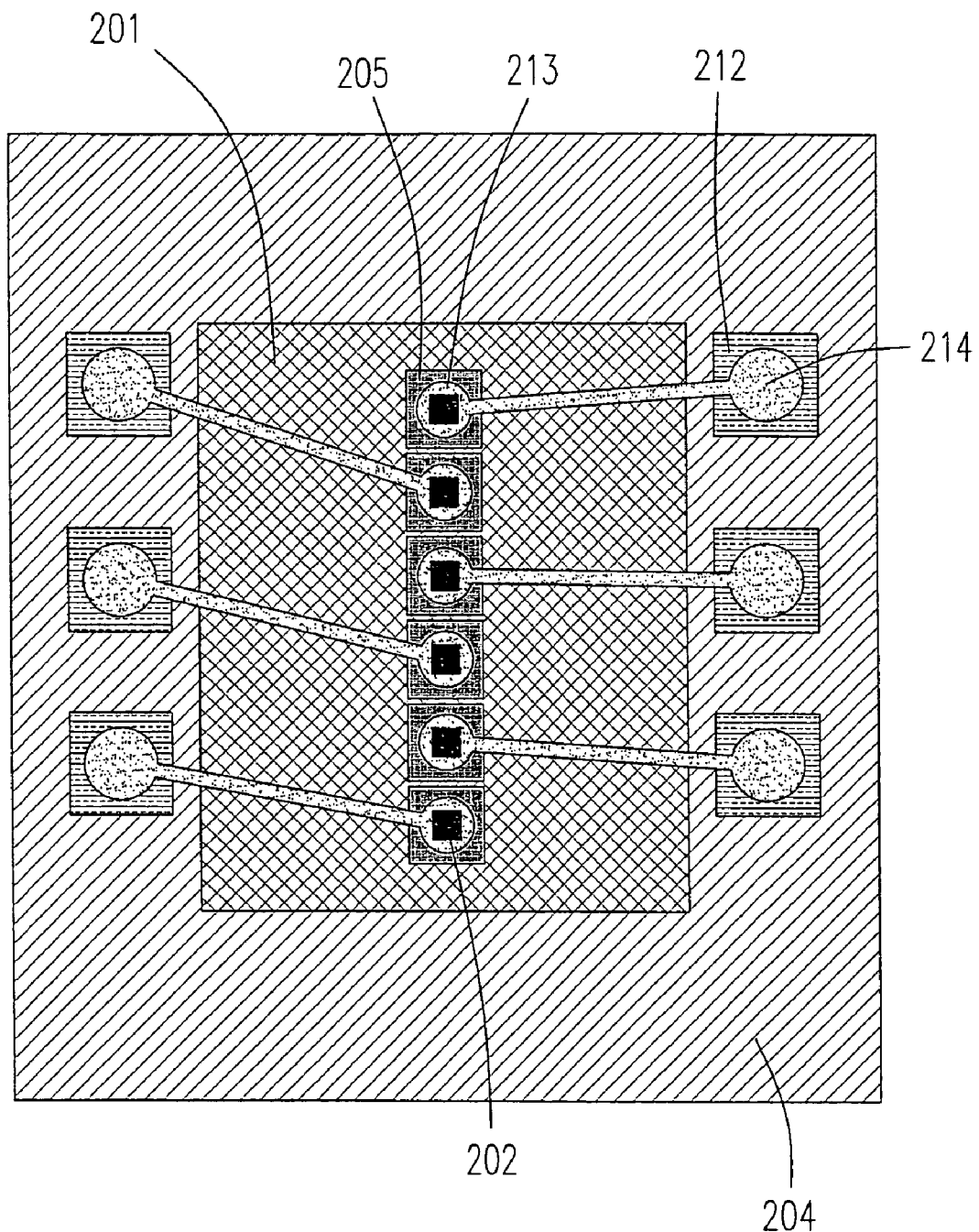
FIG. 11 is a vertical view of the packaging structure according to the second preferred embodiment of the present invention.

Please refer to FIG. 11, which is a vertical view of the packaging structure according to the second preferred embodiment of the present invention. The semiconductor chip 201 is disposed on the substrate 204 and has the input/output electrodes 202. The protecting layers 205 and 212 are formed in the surroundings of the conductor trace lines 213 and 214, respectively. The conductor trace lines 213 and 214 are in a lengthwise direction. The protecting layer of the present invention can be used to protect the conductor trace line in a lengthwise direction. Therefore, it is quite suitable for rerouting vias in the build-up circuit such that multiple protecting layers may be disposed in the build-up packaging with multiple dielectric layers.

Figure 12:
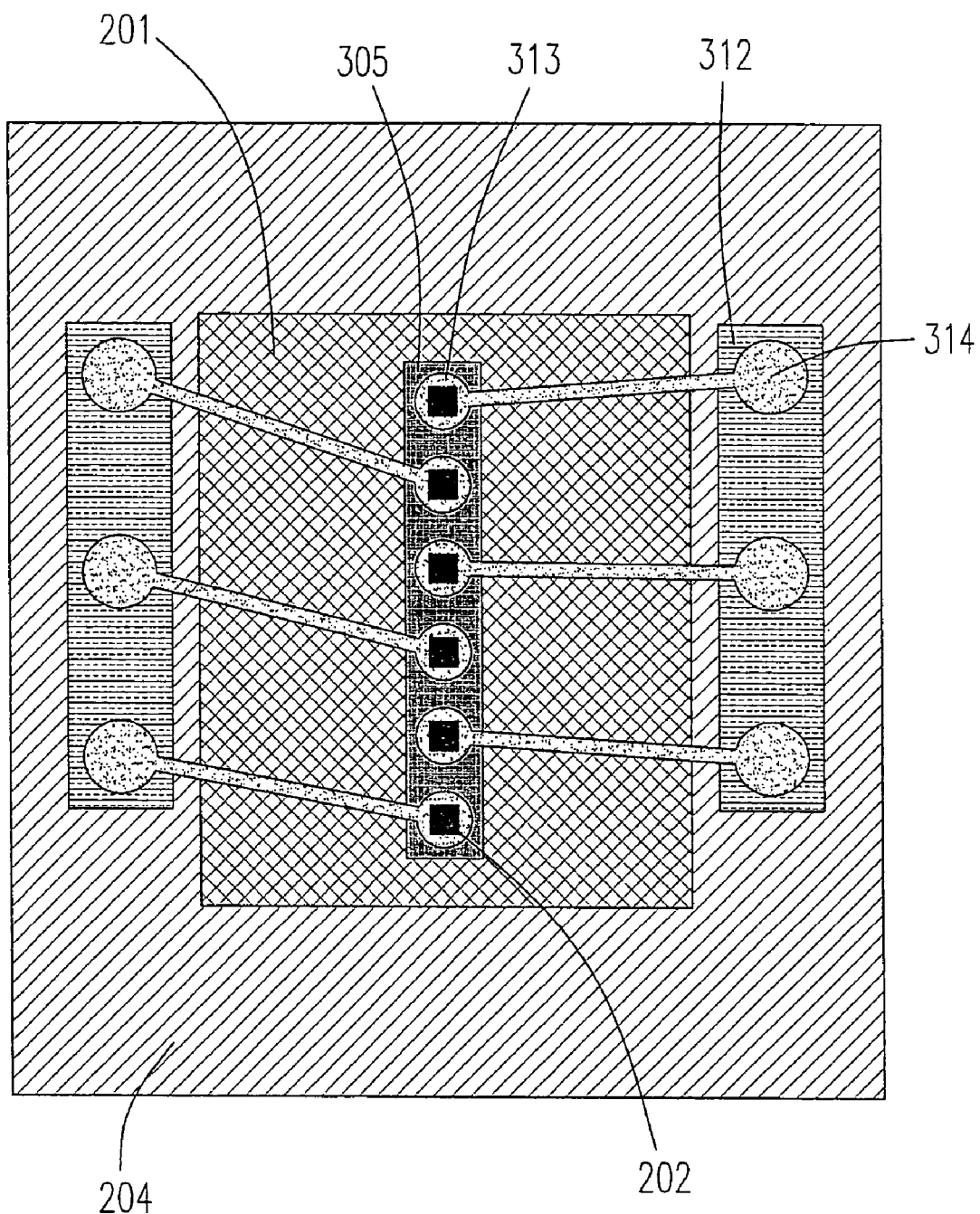
FIG. 12 is a vertical view of the packaging structure according to a third preferred embodiment of the present invention.

Please refer to FIG. 12, which is a vertical view of the packaging structure according to a third preferred embodiment of the present invention. The semiconductor chip 201 is disposed on the substrate 204 and has the input/output electrodes 202. The protecting layers 305 and 312 are formed in the surroundings of the conductor trace lines 313 and 314, respectively, and the covered areas are not limited to the surroundings of the respective conductor trace lines 313 and 314.

Figure 13:
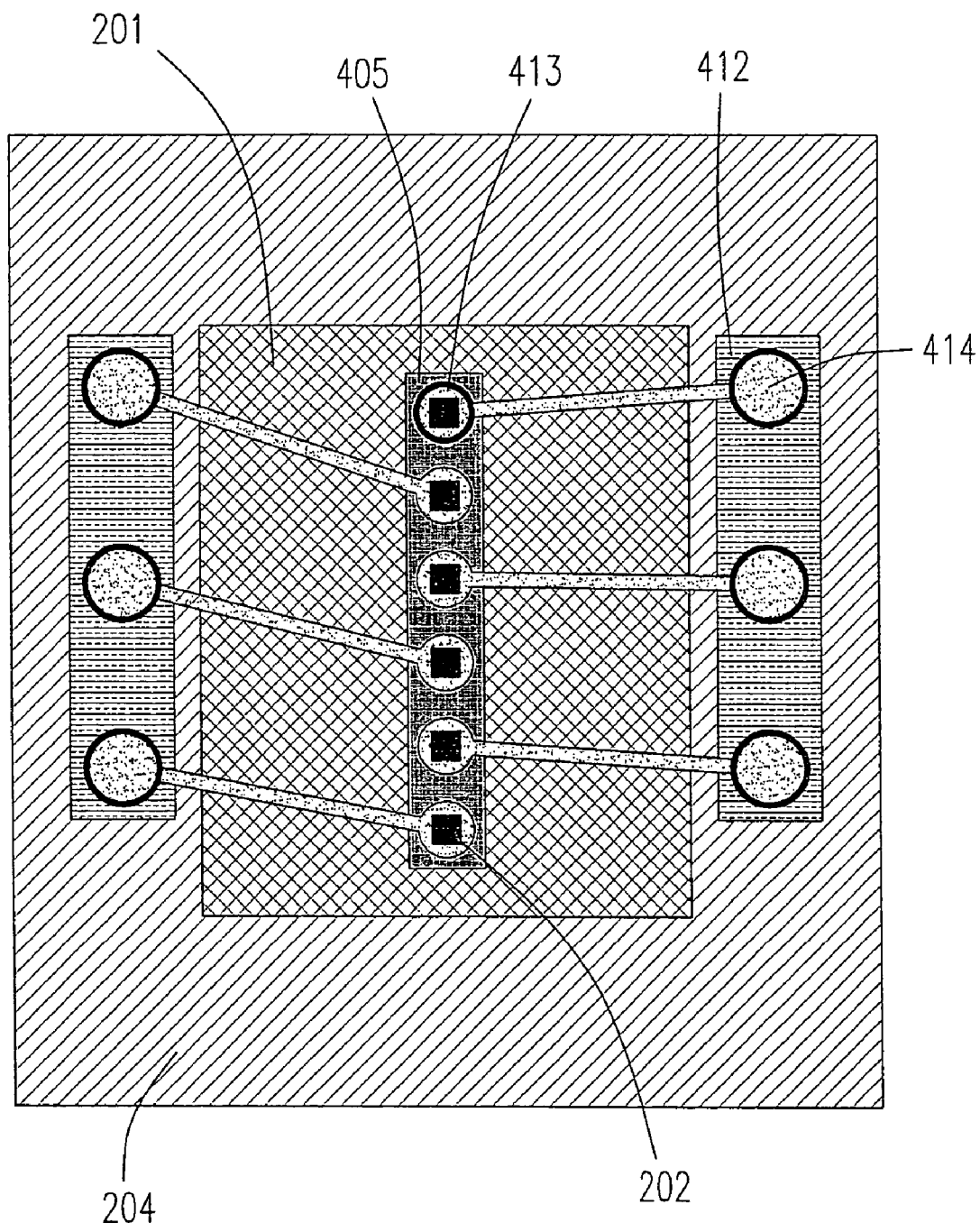
FIG. 13 is a vertical view of the packaging structure according to a fourth preferred embodiment of the present invention.

Please refer to FIG. 13, which is a vertical view of the packaging structure according to a fourth embodiment of the present invention. The semiconductor chip 201 is disposed on the substrate 204 and has the input/output electrodes 202. The protecting layers 405 and 412 are formed in the surroundings of the conductor trace lines 413 and 414 respectively without contacting therewith.

As the above-mentioned, the protecting layer is used to improve the gathering stresses between terminal contacts on the chip and the vias for rerouting, thereby raising the reliability of the conductor trace line in the electronic package structure. The protecting layer can be produced in the wafer-level manufacturing processes by coating, depositing, or printing, and can be applied in all kinds of electronic package structures.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A structure for protecting an electronic packaging contact, comprising:
    a chip having at least an electrode;
    a first dielectric layer having a top surface consisting of a first surface and a second surface, and covering the chip without covering a via located over the electrode;
    a protecting layer entirely covering the first surface without covering the via and the second surface;
    a second dielectric layer covering the first dielectric layer without covering the via;
    wherein the protecting layer is embedded by, and partially surrounded by, the second dielectric layer, and the second surface is entirely in contact with the second dielectric layer; and
    a conductor trace line formed in the via, and partially surrounded by the protecting layer, and connected to the electrode for connecting electronic signals.

2. The structure according to claim 1, wherein the protecting layer has a material composed of compressible macromolecules.

3. The structure according to claim 1, wherein the protecting layer covers at least a surrounding of the conductor trace line without contacting therewith.

4. The structure according to claim 1, wherein the conductor trace line is in a lengthwise direction.

5. A structure for protecting an electronic packaging contact, comprising:
    a chip having at least an electrode;
    a substrate mounted on the chip for supporting and distracting heat from the chip;
    a first dielectric layer having a top surface consisting of a first surface and a second surface, and covering the chip without covering a via located over the electrode;
    a protecting layer entirely covering the first surface without covering the via and the second surface;
    a second dielectric layer covering the first dielectric layer without covering the via;
    wherein the protecting layer is embedded by, and partially surrounded by, the second dielectric layer, and the second surface is entirely in contact with the second dielectric layer; and
    a conductor trace line formed in the via, partially surrounded by the protecting layer, and connected to the electrode for connecting electronic signals.

6. The structure according to the claim 5, wherein the substrate is an organic electronic substrate.

7. The structure according to claim 5, wherein the substrate is a metal substrate.

8. The structure according to claim 5, wherein the protecting layer has a material composed of compressible macromolecules.

9. The structure according to claim 5, wherein the protecting layer covers at least a surrounding of the conductor trace line without contacting therewith.

10. The structure according to claim 5, wherein the conductor line is in a lengthwise direction.

11. A semiconductor structure, comprising:
    a chip having at least an electrode;
    a first dielectric layer having a top surface consisting of a first surface and a second surface, and covering the chip without covering a via located over the electrode;
    a protecting layer entirely covering the first surface without covering the via and the second surface;
    a second dielectric layer covering the first dielectric layer without covering the via, wherein the protecting layer is embedded by, and partially surrounded by, the second dielectric layer, and the second surface is entirely in contact with the second dielectric layer; and
    a conductor trace line formed in the via, partially surrounded by the protecting layer, and connected to the electrode for communicated electronic signals.

12. The structure according to claim 11, wherein the electrode is surrounded by the first dielectric layer.

13. The structure according to claim 1, wherein the electrode is surrounded by the first dielectric layer.

14. The structure according to claim 1, wherein the conductor trace line is partially surrounded by the second dielectric layer.

15. The structure according to claim 5, wherein the electrode is surrounded by the first dielectric layer.

16. The structure according to claim 5, wherein the conductor trace line is partially surrounded by the second dielectric layer.

17. The structure according to claim 1, wherein the via passes through at least the second dielectric layer and the protecting layer.

* * * * *